(12) United States Patent
Ghandour

(10) Patent No.: US 8,227,287 B2
(45) Date of Patent: Jul. 24, 2012

(54) PARTIALLY TRANSMITTED IMAGED LASER BEAM FOR SCRIBING SOLAR CELL STRUCTURES

(75) Inventor: Osman Ghandour, Morgan Hill, CA (US)

(73) Assignee: Miasole, Santa Clara, CA (US)

( * ) Notice: Subject to any disclaimer, the term of this patent is extended or adjusted under 35 U.S.C. 154(b) by 55 days.

(21) Appl. No.: 12/904,958

(22) Filed: Oct. 14, 2010

(65) Prior Publication Data
US 2012/0094422 A1 Apr. 19, 2012

(51) Int. Cl.
*H01L 21/301* (2006.01)
(52) U.S. Cl. .......... 438/68; 438/114; 438/463; 438/940; 257/E21.238
(58) Field of Classification Search .................... 438/68, 438/114, 463, 940; 257/E21.238
See application file for complete search history.

(56) References Cited

U.S. PATENT DOCUMENTS

| | | | |
|---|---|---|---|
| 4,994,639 A | 2/1991 | Dickinson et al. | |
| 5,593,901 A | 1/1997 | Oswald et al. | |
| 5,686,171 A * | 11/1997 | Vokoun et al. | 428/209 |
| 5,795,815 A * | 8/1998 | Vokoun et al. | 438/462 |
| 5,943,591 A * | 8/1999 | Vokoun et al. | 438/462 |
| 6,341,029 B1 | 1/2002 | Fillion et al. | |
| 6,919,162 B1 | 7/2005 | Brennen et al. | |
| 8,048,706 B1 * | 11/2011 | Ghandour et al. | 438/57 |
| 2010/0233386 A1 * | 9/2010 | Krause et al. | 427/596 |

OTHER PUBLICATIONS

U.S. Appl. No. 12/904,922, "Ablative Scribing of Solar Cell Structures", Osman Ghandour et al., filed Oct. 14, 2010.
U.S. Appl. No. 12/904,944, "Dithered Scanned Laser Beam for Scribing Solar Cell Structures", Osman Ghandour, filed Oct. 14, 2010.
Jacobs, Geoff, "Understanding Spot Size for Laser Scanning", Professional Surveyor Magazine, Oct. 2006, 2 pages.
Patel, Rajesh, et al., "Why Pulse Duration Matters in Photovoltaics: Short Pulses for More Robust, Higher Quality Laser Scribes," Photovoltaics, No. 1, Jan. 2010, pp. 21-24.
Gordillo, G., et al., "Optical and Structural Characterization of $CuInSe_2$ (CIS) Thin Films Grown by Means of Process in Two Stages", Superficies y Vacio, Jun. 2003, vol. 16, No. 2, 5 pages.
Zengir, Bengul, et al., "Optical Absorption in Polyerystalline CdTe Thin Films", Jornal of Arts and Sciences, May 5, 2006, pp. 103-116.

* cited by examiner

*Primary Examiner* — George Fourson, III
(74) *Attorney, Agent, or Firm* — Weaver Austin Villeneuve & Sampson LLP

(57) ABSTRACT

Provided herein are methods and systems for scribing solar cell structures to create isolated solar cells. According to various embodiments, the methods involve scanning an excimer laser beam along a scribe line of a solar cell structure to ablate electrically active layers of the structure. A photomask having variable transmittance is disposed between the beam source and the solar cell structure. The transmittance is calibrated to produce variable fluence levels such that a stepped scribed profile is obtained. In certain embodiments, a front contact/absorber/back contact stack is removed along a portion of the scribe line, while a front contact/absorber stack is simultaneously removed along a parallel portion, with the back contact layer unremoved. In this manner, the scribe electrically isolates solar cells on either side of the scribe line, while providing a contact point to the back contact layer of one of the solar cells for subsequent cell-cell interconnection.

11 Claims, 10 Drawing Sheets

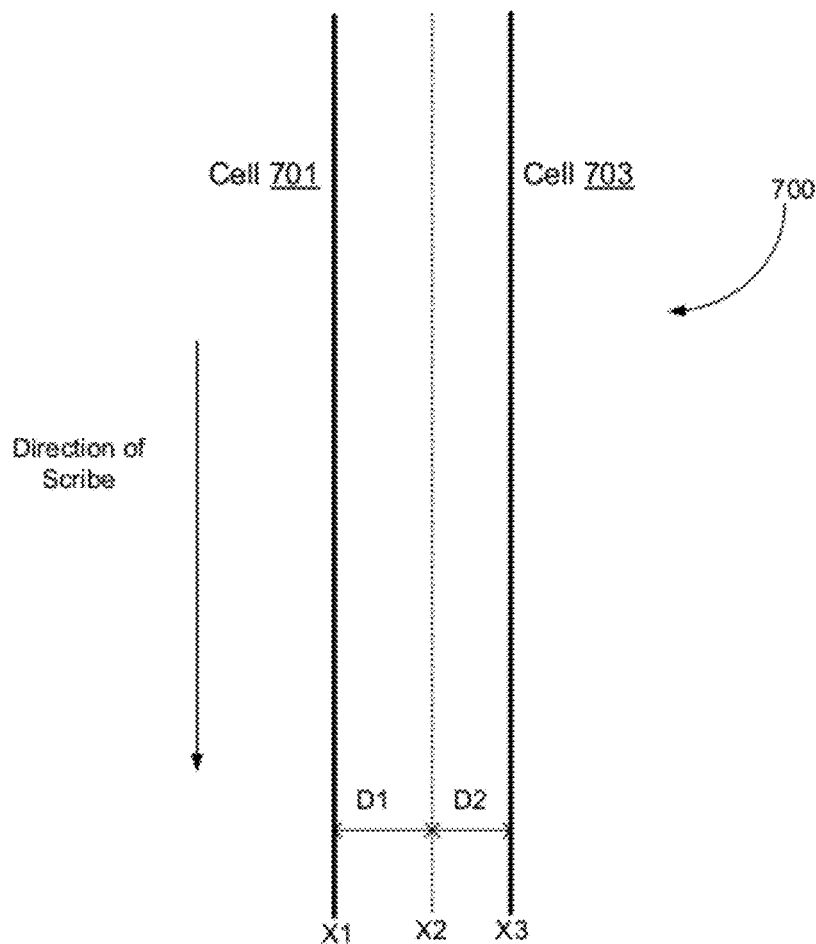
FIG. 7
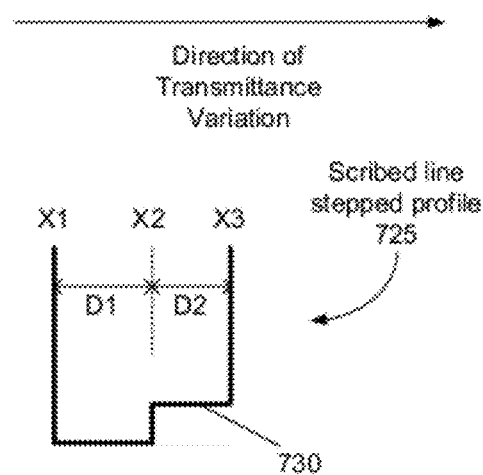

PARTIALLY TRANSMITTED IMAGED LASER BEAM FOR SCRIBING SOLAR CELL STRUCTURES

BACKGROUND OF THE INVENTION

Photovoltaic cells are widely used for generation of electricity, with multiple photovoltaic cells interconnected in module assemblies. Such modules may in turn be arranged in arrays and integrated into building structures or otherwise assembled to convert solar energy into electricity by the photovoltaic effect.

Certain photovoltaic cell fabrication processes involve monolithic integration of the cells of a module. For thin film solar modules, this involves depositing thin film materials on a substrate to form a light absorbing layer sandwiched between electrical contact layers. The front or top contact is a transparent and conductive layer for current collection and light enhancement, the light absorbing layer is a semiconductor material, and the back contact is a conductive layer to provide electrical current. In one example of a fabrication process, a metallic back electrical contact layer is deposited on a substrate. A p-type semiconductor layer is then deposited on the back contact electrical contact layer and an p-type semiconductor layer is deposited on the p-type semiconductor layer to complete a p-n junction. Any suitable semiconductor materials, such as CIGS, CIS, CdTe, CdS, ZnS, ZnO, amorphous silicon, polycrystalline silicon, etc. may be used for these layers. A top transparent electrode layer is then deposited on the p-n junction. This layer may be a conductive oxide or other conductive film and is used for current collection. The thin film materials are appropriately scribed with a laser beam to form multiple interconnected cells on the substrate.

SUMMARY OF THE INVENTION

Provided herein are methods and systems for scribing solar cell structures to create isolated solar cells. According to various embodiments, the methods involve scanning an excimer laser beam along a scribe line of a solar cell structure to ablate electrically active layers of the structure. A photomask having variable transmittance is disposed between the beam source and the solar cell structure. The transmittance is calibrated to produce variable fluence levels such that a stepped scribed profile is obtained. In certain embodiments, a front contact/absorber/back contact stack is removed along a portion of the scribe line, while a front contact/absorber stack is simultaneously removed along a parallel portion, with the back contact layer unremoved. In this manner, the scribe electrically isolates solar cell structures on either side of the scribe line, while providing a contact point to the back contact layer of one of the solar cell structures for subsequent cell-cell interconnection.

Also provided are systems for laser scribing layers of thin film photovoltaic stacks to produce monolithically integrated modules of interconnected solar cells. According to various embodiments, such a system includes an excimer laser beam source, a variable transmittance photomask to pattern the beam, and optics to direct the patterned radiation to a substrate. The photomask patterns include one or more lines, through which light is transmitted to ablate layers of a solar cell structure along corresponding scribe lines of the structure. At least some of the light transmitting regions of the photomask have transmittance that varies across the width of the line, e.g., in a step-wise variation.

One aspect of the invention relates to a method of forming a monolithically integrated thin film photovoltaic module, including providing a substrate hiving thin film photovoltaic materials deposited thereon, identifying a scribe line across the substrate; providing a photomask having at least one transmission region including a length and a width, said transmission region having a variable transmittance across its width; aligning the transmission region with the scribe line; and scanning an excimer laser beam along the length of the transmission region to form electrically unconnected photovoltaic cells on either side of the scribe line, wherein a scribed line profile formed by scanning the laser beam is stepped.

In certain embodiments, scanning the laser beam across the substrate ablates the thin film photovoltaic materials completely to leave an insulating layer exposed along a first portion of the scribe line; and simultaneously ablates the thin film photovoltaic materials to leave a conductive thin film layer exposed along a second portion of the scribe line, wherein said first and second portions are substantially co-extensive with the scribe line.

In certain embodiments, the photovoltaic materials are thin film layers deposited on the substrate including a light absorbing layer or layers sandwiched between front and back electrical contact layers. The resulting photovoltaic cells each include a back electrical contact layer, an absorber layer and a top electrical contact layer. In certain embodiments, the stepped scribed line profile is defined by a substantially vertical first sidewall including the back electrical contact layer, the absorber layer and the top electrical contact layer; a bottom including an insulating layer; a step including the back contact layer; and a substantially vertical second sidewall extending from the back contact step and including the absorber layer and the top electrical contact layer. Examples of back contact layers include molybdenum, niobium, copper, silver, chromium, titanium, and zirconium. Examples of absorber layers include CIGS, CIS, CdTe, amorphous silicon and $Cu_2ZnSnS_4$ (CZTS).

The width of the stepped portion of the scribed line profile may be about half the width of the scribe line, although this may vary depending on implementation. After scribing, in certain embodiments the method further involves forming insulator and conductive material in a portion of the stepped scribed profile to electrically interconnect the unconnected photovoltaic cells. In certain embodiments where the stepped portion of the scribed line profile includes an exposed back electrical contact surface, a conductive material is printed or otherwise deposited to connect this surface to the top electrical contact of the adjacent cell.

In certain embodiments, scribing the scribe line involves scanning an excimer laser beam along the length of the transmission region of the mask, moving the substrate relative to the photomask to align the transmission region with an unscanned length of the scribe line, and scanning the excimer laser beam along the length of the unscanned length. This may be repeated one or more times as necessary depending on the size of the photomask and related optical components.

According to various embodiments, the photomask includes a reflective coating on a dielectric substrate, e.g., a fused silica or quartz substrate. The transmittance of the transmission region may be characterized by a bimodal distribution, formed by gray scale type coating or a dot matrix coating. Each mode of the bimodal distribution may be characterized by a constant or variable transmittance. For example, a variable transmittance photomask is characterized by a region of 100% transmittance and a region of 50% transmittance, with the dimensions of the 100% region corresponding to the unstepped portion of the scribed line profile, and the 50% region corresponding to the stepped portion of the scribed line profile.

Also provided is a system for forming monolithically integrated thin film photovoltaic cells. According to various embodiments, the system includes an excimer laser; a variable transmittance photomask, and a multi-element lens configured to direct light from the laser filtered by the photomask to a substrate, wherein an intensity profile of the directed light is stepped. The photomask includes a linear segment having a bimodal transmittance distribution; the transmittance varying across the width with the linear segment bounded by non-transmissive regions of the photomask. In certain embodiments, the system further includes a substrate having thin film photovoltaic materials deposited thereon. The substrate may also have a line along which the photovoltaic materials are to be scribed. The dimensions of the linear segment of the photomask are configured to correspond to the scribe line dimensions. In certain embodiments, the photomask is a 1× photomask with the width of the segment equal to that of the desired scribe, e.g., between about 25 and 150 microns. In other embodiments, the photomask is a 2×, 3×, 4×, 5× (or any other degree of magnification) photomask, with the magnification factor indicating the de-magnification of the beam passing through the mask after it passes through the after-mask-imaging optics. In certain embodiments, the multi-element lens is operable to de-magnify a beam after is passes through the mask. In these embodiments, the dimensions of the linear segment correspond to scribe line dimensions, adjusted appropriately to account for the de-magnification.

These and other aspects of the invention are described further below with reference to the figures.

BRIEF DESCRIPTION OF THE DRAWINGS

FIG. 7 is a schematic representation of a scribe line indicating a scribe direction and a direction of transmittance variation.

DETAILED DESCRIPTION OF THE PREFERRED EMBODIMENTS

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention. In the following description, numerous specific details are set forth in order to provide a thorough understanding of the present invention. The present invention may be practiced without some or all of these specific details. In other instances, well known mechanical apparatuses and/or process operations have not been described in detail in order not to unnecessarily obscure the present invention.

Provided herein are systems for laser scribing layers of thin film photovoltaic stacks to produce monolithically integrated modules of interconnected solar cells. According to various embodiments, provided are excimer laser imaging-based systems including variable transmittance photomasks. The photomask patterns include one or more lines, through which light is transmitted to ablate layers of a solar cell structure along corresponding scribe lines of the structure. At least some of the light transmitting regions of the photomask have transmittance that varies across the width of the line, e.g., in a step-wise variation.

Also provided herein are methods for laser scribing layers of thin film photovoltaic stacks to produce monolithically integrated modules of interconnected solar cells. According to various embodiments, the methods involve scanning an excimer beam over a photomask that includes a region of a first transmittance, and a region of a second transmittance, where the first and second transmittances are different, and the first and second regions are parallel and abut each other. In certain embodiments, the beam is scanned to cover a region of the mask that is totally transmitting and another region that is partially transmitting. The transmission of the partially transmitting region is calibrated so as to produce a fluence level that removes front contact-absorber layers along one region of a scribe line, while leaving a back contact layer substantially intact along that region. Simultaneously, the fluence transmitted through the totally transmitting region removes the front contact-absorber-back contact layers along a parallel region of the scribe. The result is two electrically unconnected photovoltaic stacks on either side of the scribe line, which can be connected in series (front contact to exposed back contact) in subsequent processing. These and other aspects of the invention are described further below.

Figure 1A:
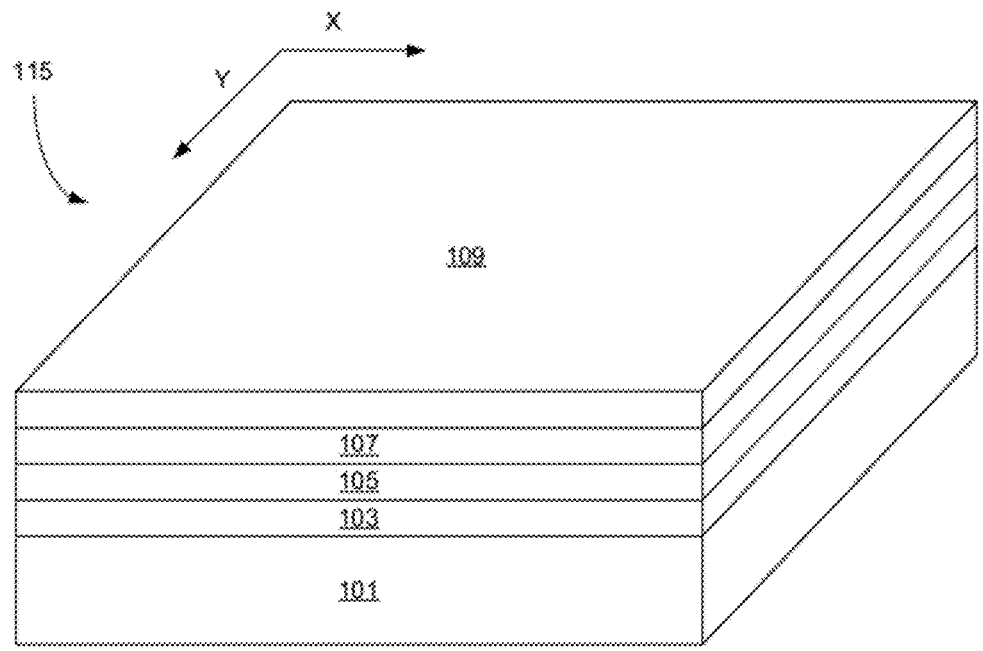
FIG. 1A is a schematic illustration of a substrate having thin film photovoltaic materials deposited thereon according to certain embodiments.

Solar module fabrication often involves depositing thin films on relatively large area substrates. Individual cells are then produced from the substrates having thin film materials deposited thereon. Laser scribing of thin film photovoltaic layers to form individual cells eliminates the need to mechanically cut the substrate and reconnect the formed cells in series. FIG. 1A shows a perspective view of an example of a substrate 101 supporting thin films 103, 105, 107 and 109 that together form thin film photovoltaic stack 115. For the purposes of illustration, the figure is not to scale; for example, thickness of the substrate may be on the order of mils, the thickness of the thin film stack on the order of microns (or hundredths of mils) with the x- and y-dimensions of the substrate on the order of feet. Substrate 101 provides mechanical support for the thin film materials, and is generally an insulator such as silicon dioxide, glass or other material. In certain embodiments, substrate 101 may include a metal or conductive substrate coated with silicon dioxide layer or other insulator.

Back electrical contact layer 103 provides electrical contact to allow electrical current to flow through the photovoltaic cell, and may be made of any appropriate material, e.g., molybdenum, niobium, copper, silver, aluminum, etc. A p-type semiconductor layer 105 is deposited on back electrical contact layer 103 and an n-type semiconductor layer 107 is deposited on p-type semiconductor layer 105 to complete a p-n junction. According to various embodiments, any suitable semiconductor materials, such as CIGS, CIS, CdTe, CdS, ZnS, ZnO, amorphous silicon, polycrystalline silicon, etc. are used for layers 105 and 107. For example, the p-type semiconductor layer 105 may be CIGS or CIS, and the n-type semiconductor layer 107 may be CdS or a cadmium free material, such as ZnS, ZnO, etc. Layer 105 may also be referred to as an absorber layer, and layer 107 as a buffer layer. Front transparent electrical contact layer 109 is deposited on the p-n junction. In certain embodiments, front transparent electrical contact layer 109 is a transparent conducting oxide (TCO), for example, zinc oxide, aluminum-doped zinc oxide (AZO) and indium tin oxide (ITO). FIG. 1A shows an example of a thin film stack on a substrate; other materials may be used in addition to or instead of any of these materials. In certain embodiments, thin film layers are deposited on a front transparent substrate, with the front electrical contact layer deposited on the transparent substrate, followed by absorber layers and the back electrical contact layer.

Figure 1B:
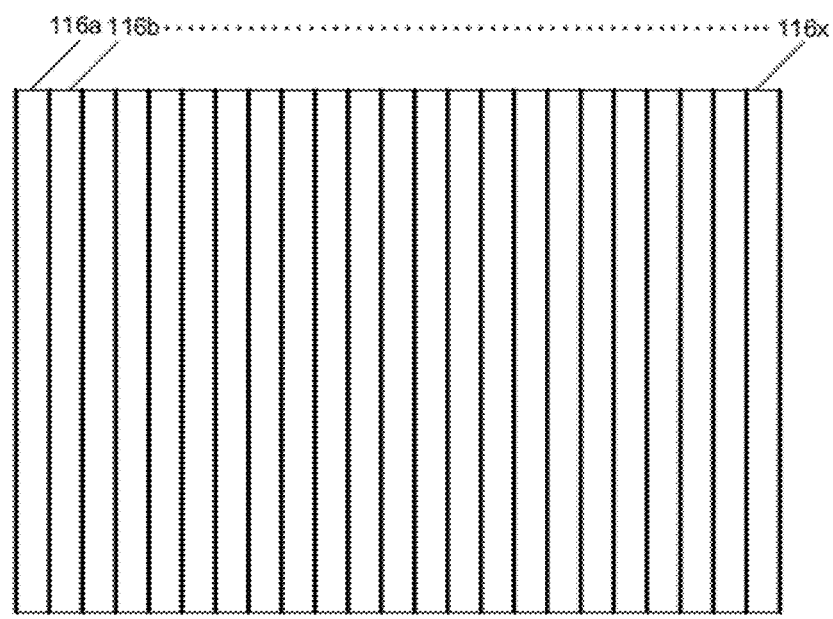
FIG. 1B is a schematic illustration of a top view of a monolithically integrated module.

FIG. 1B shows a top view of cells of monolithically integrated module: instead of a single large area photovoltaic stack, scribe lines are used to create multiple cells 116a, 116b . . . 116x, connected in series, with the front electrical contact of each cell connected to the back electrical contact of an adjacent cell (not shown). In certain embodiments, the inventive methods are used to scribe lines from the front, with the laser beam incident on an exposed film.

Figure 2:
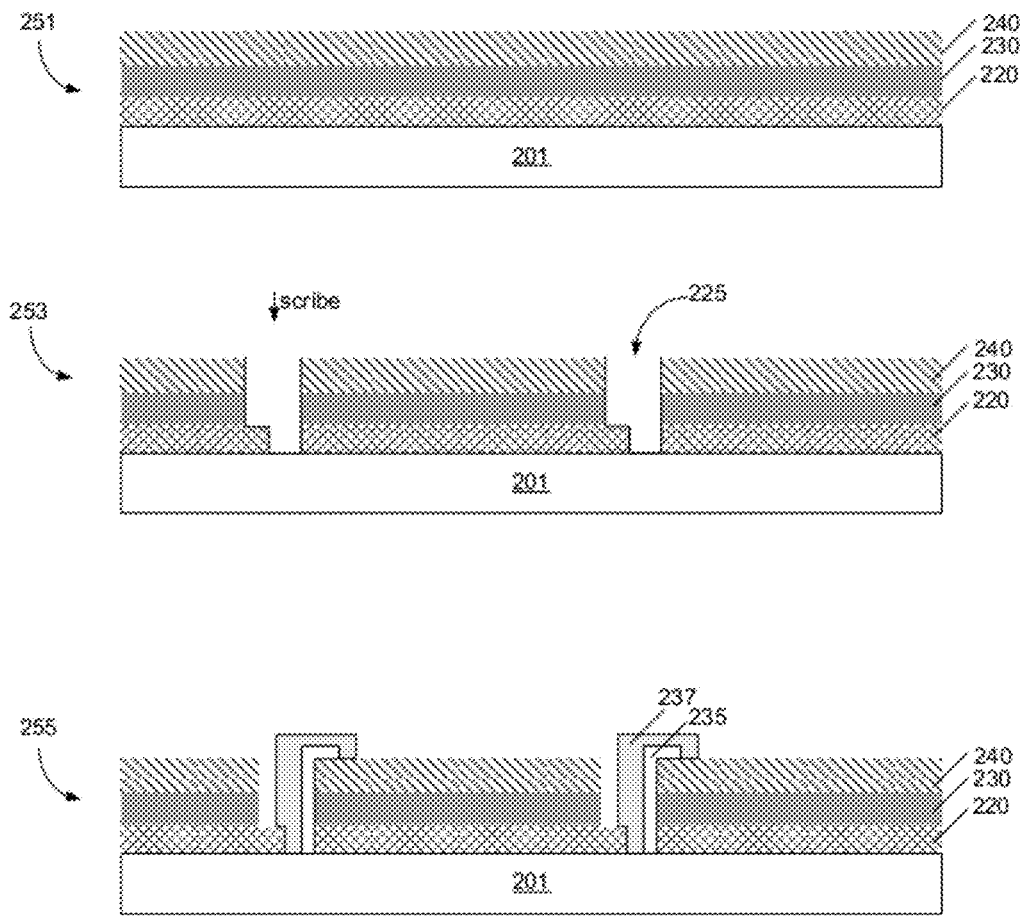
FIG. 2 is a schematic illustration of a solar module at various stages of another monolithic integration process according to various embodiments.

FIG. 2 provides an example of a monolithic integration process employing laser scribing, in which first contact layer 220, absorber/buffer layers 230 and second contact layer 240 are deposited on a substrate 201. In one example, substrate 201 is a silicon oxide coated substrate, first contact layer 220 is a back contact film such as molybdenum and second contact layer 240 is a TCO layer. The as-deposited stack is shown at 251. At 253, stepped scribed line profiles 225 are shown. Methods of laser scribing to produce the stepped profiles are described below. At 255, insulators 235 and conductive interconnects 237 are depicted. In certain embodiments, insulators 235 are cured printed insulator ink and conductive interconnects 237 are cured printed silver ink, though other materials may be employed. The separated cells are now electrically connected in series via the interconnects 237. While FIG. 2 provides an example of an integration process for monolithically integrated solar cells, the inventive scribing processes described below are not limited to these particular processes but may be used with other solar module integration processes that employ laser scribing.

Figure 3:
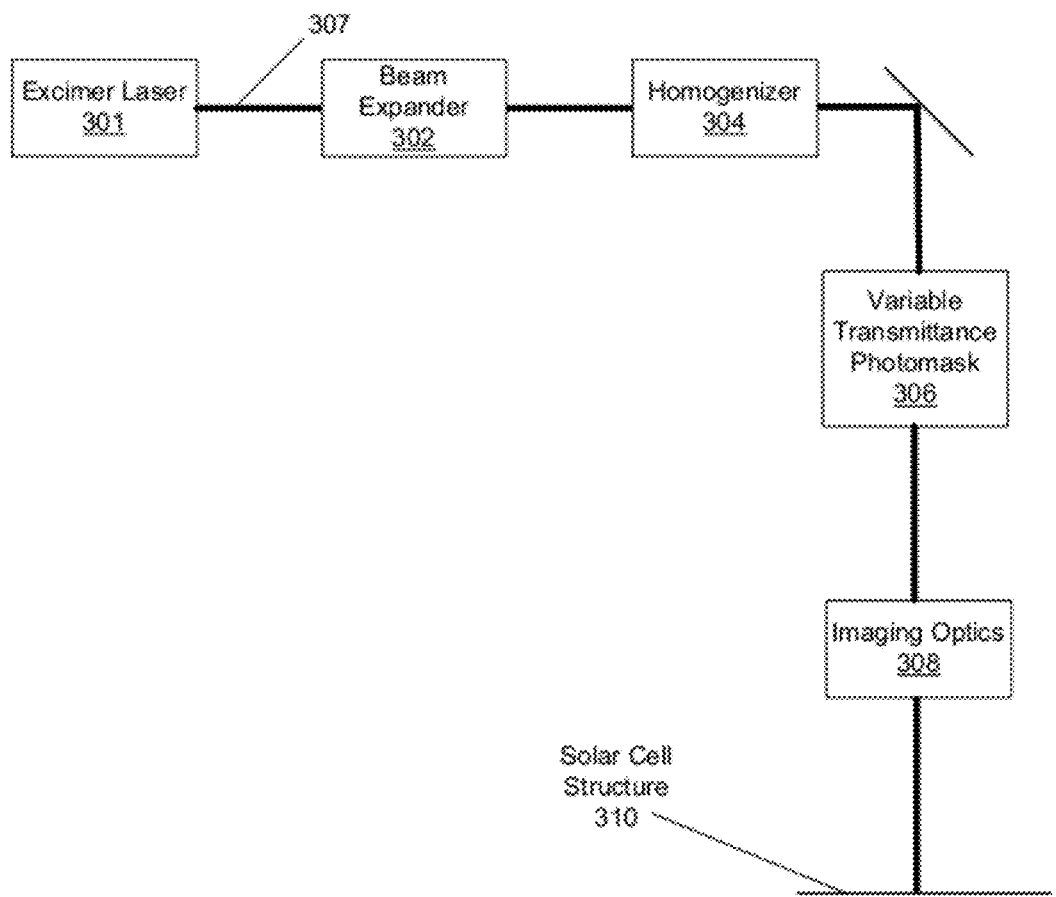
FIG. 3 is a block diagram illustrating certain components of a system according to various embodiments.

FIG. 3 provides a high-level example of components in a system for scribing solar cell structures according to certain embodiments. Excimer laser 301 provides a laser beam 307. The beam 307 output from the excimer laser 301 is a rectangular beam with almost a top-hat intensity profile in one axis and a pseudo Gaussian intensity profile in the other axis. Optics including a beam expander 302 and homogenizer 304 are present to produce a certain size beam having a flat intensity profile in both axes. The uniform beam is incident on a photomask 306, which defines the pattern of the radiation incident on the solar cell structure. The beam passes through imaging optics 308, which may include various lenses to direct the beam to solar cell structure 310. The system may also include a galvo scanner, or other type of scanner, to scan the beam along a scribe line. Components of the system are discussed further below with respect to FIG. 7.

Figure 4A:
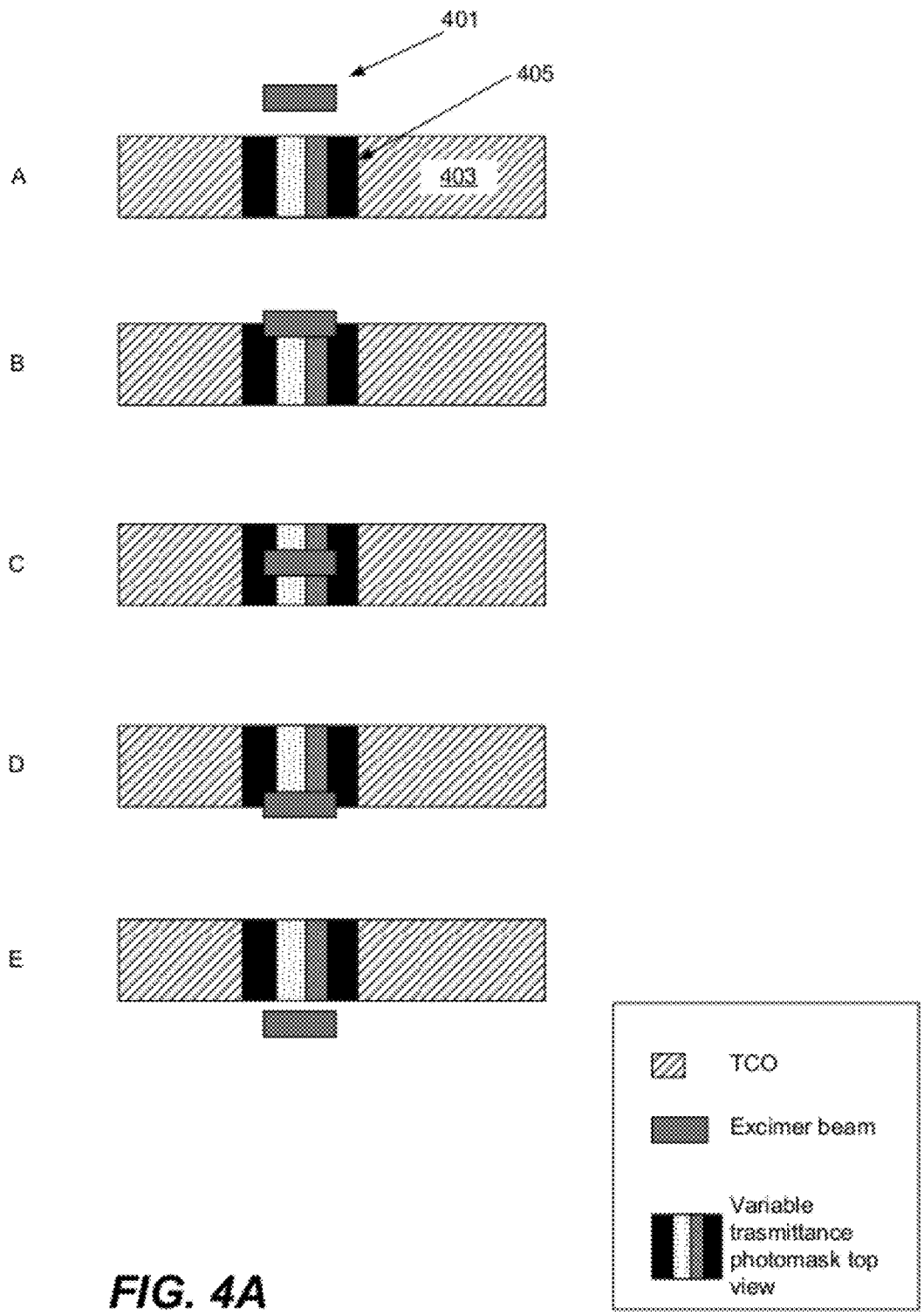
FIG. 4A provides a top view of a variable transmittance photomask and laser beam as the laser beam scans over the mask to ablate an underlying solar cell structure.
Figure 4B:
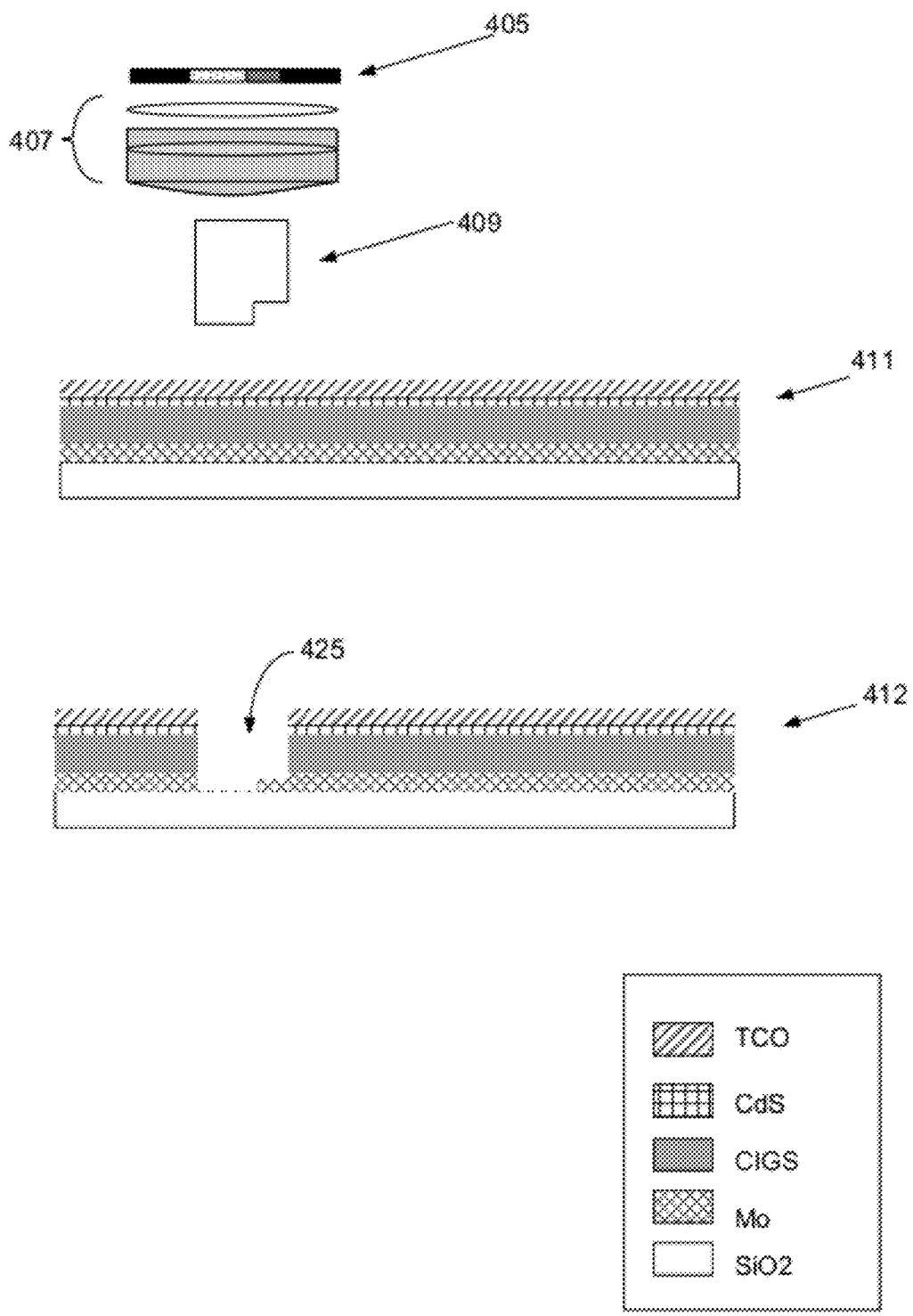
FIG. 4B provides a cross-sectional view of a variable transmittance photomask, imaging optics and solar cell structure according to certain embodiments.

FIGS. 4A and 4B provide top and cross-sectional views of the variable transmittance photomask. First in FIG. 4A, top views A-E of an excimer beam 401 as it is scanned over photomask 405 are shown. Photomask 405 overlies the top layer of the structure to be scribed, in this instance, top conducting oxide (TCO) layer 403. In FIG. 4B, a cross-section of photomask 405, imaging optics 407, imaged beam intensity profile 409 and solar cell structure 411 is depicted. In the example shown, imaging optics include a multi-element lens that images the object, in this case the mask, onto the substrate which lies in the image plane at a certain desired de-magnification factor. While one lens can effectively do this imaging, in certain embodiments, multi-elements are used to reduce distortion and, hence, produce a good image quality with a good edge resolution. One skilled in the art will understand that the optical components may vary according to the implementation. Solar cell structure includes TCO electrode layer, CdS buffer layer, CIGS absorber layer, Mo electrode layer and $SiO_2$ substrate. The composition and arrangement of the particular solar cell structure will vary according to implementation. Imaged beam intensity 409 corresponds to the transmittance of photomask 405: the region of the mask having higher transmittance provides more intense radiation than the region of lower transmittance. At 412, the scribed structure including a stepped profile 425 in which the Mo electrode is exposed over part of the scribed line.

Figure 5:
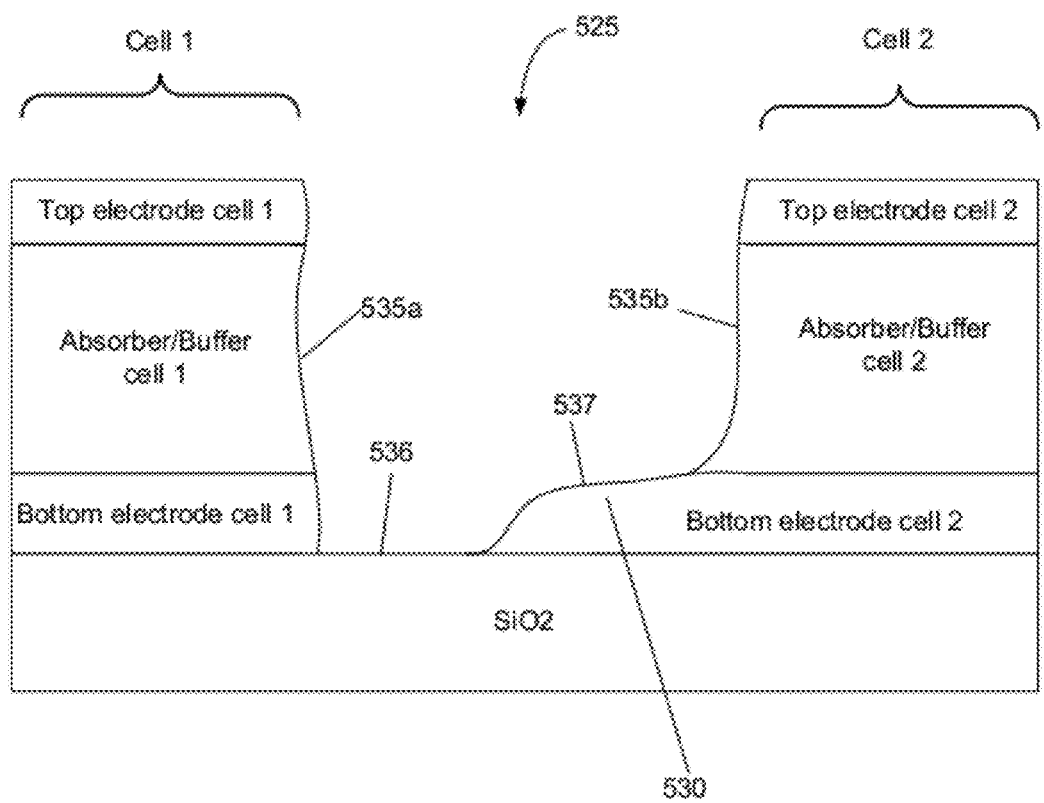
FIG. 5 is a schematic representation of an example of a stepped scribed line profile.

FIG. 5 depicts an example of a stepped scribed line profile in more detail. Stepped scribed line profile 525 includes a step 530 in between two cells. The profile includes two substantially parallel sidewalls 535a and 535b; 535a including a full photovoltaic stack, including the bottom electrode, absorber and buffer layers and top electrode (TCO) layer of one cell; 535b including the absorber layer, buffer layer, and top electrode (TCO) layer of the adjacent cell. According to various embodiments, sidewall 535b also includes a part of the thickness of the bottom electrode, though this is not necessarily so in all embodiments. The stepped profile includes a bottom surface portion 536 disposed between step 525 and sidewall 535a. This bottom surface portion electrically isolates the solar cells on either side of the scribed line. A portion of the bottom contact of one cell forms the step 530, which extends past sidewall 535b toward sidewall 535a without contacting any part of sidewall 535a, and is characterized by a top surface 537 of exposed bottom contact material.

Figure 6:
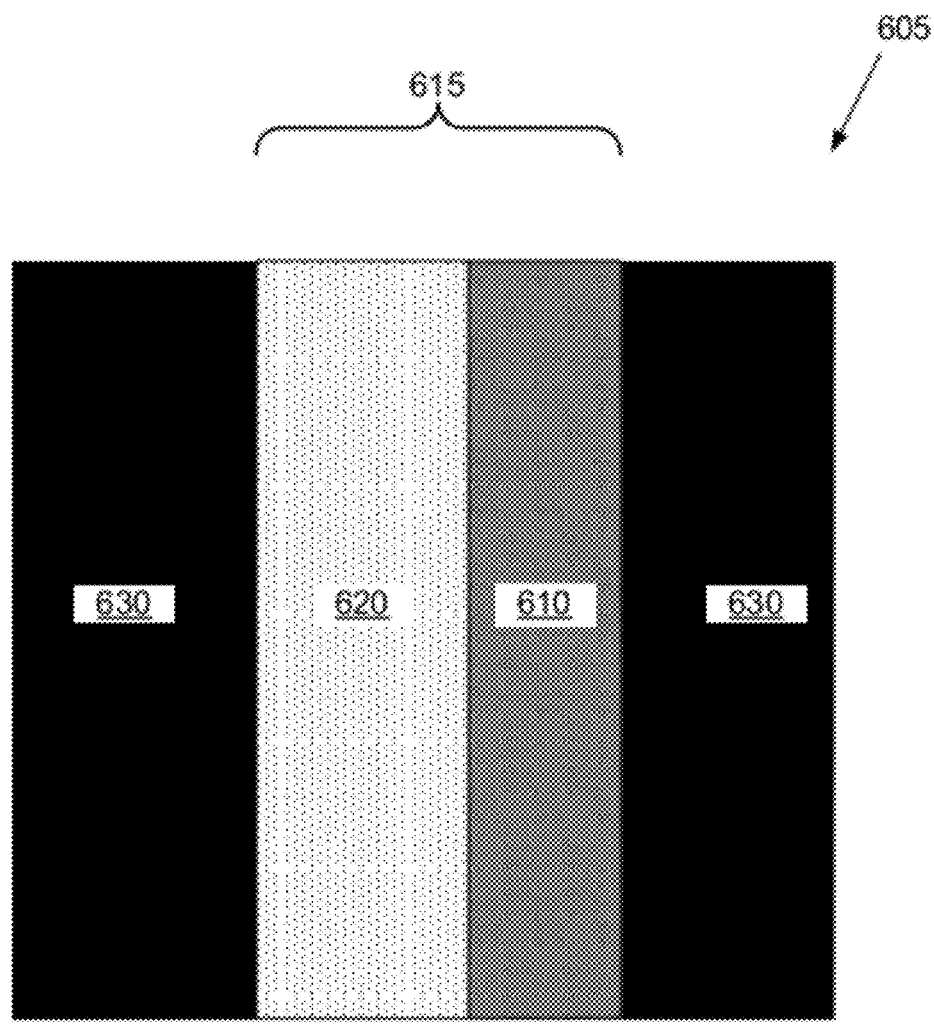
FIG. 6 depicts a variable transmittance photomask according to various embodiments.

FIG. 6 provides a top view of photomask 605, including a linear pattern having variable transmittance. The pattern is formed by linear transmitting region 615 and non-transmitting regions 630 abutting linear transmitting region 615. Transmitting region 615 includes two parallel regions 610 and 620 having different transmittance levels. In the depicted embodiments, region 620 has a higher transmittance than region 610. In certain embodiments, region 620 has a transmittance of 100%, transmitting all of the laser beam fluence at the mask plane. The transmittance of region 610 depends on the implementation but is between about 10%-90% or about 50%-90% in certain embodiments. Region 610 is referred to as the partially transmitting region, though it should be noted that in certain embodiments region 620 may also be partially transmitting, still having a higher transmittance than partially transmitting region 610.

The transmission of the partially transmitting region 610 is calibrated so as to produce a fluence level that removes the full CIGS/CdS/TCO stack, roughly leaving the Mo layer unremoved. Simultaneously, the fluence transmitted through region 620 produces a fluence level that removes the full stack as well as the Moly layer all the way to the $SiO_2$. The width of region 615 corresponds to the width of the desired scribe with the imaging system de-magnification factor taken into account. Similarly, the widths of regions 610 and 620 also correspond to the dimensions of the desired scribed line profile with the imaging system de-magnification factor taken into account.

It should be noted that the while FIG. 6 depicts the photomask as a rectangle with the transmittance varying along the minor axis, the photomask may be any appropriate shape. For example, it may be sized such that the transmittance varies along the major axis of a rectangle, or it may be a square. Regardless of the actual size or shape of the mask, the dimension along which the transmittance varies is referred to as the width of the pattern or width of the transmitting region of the pattern with the perpendicular dimension referred to as the length. This is consistent with the scribe line dimensions with which the photomask is optically aligned.

According to various embodiments, the scribed line having a stepped profile is formed in a one or more passes along the scribe line. Depending on the length of the desired scribe line, the mask and imaging system may have to be stepped and repeated to cover a work envelope that will produce the desired scribe lengths. For example, in certain embodiments, a scribe length is on the order of 1 meter.

FIG. 7 shows a schematic of a scribe line 700, in between two cells, cell 701 and cell 703. A scribe direction and a transmission variation direction, substantially perpendicular to the scribe direction, are indicated. Three positions, X1, X2 and X3 are indicated across the scribe line, X1 indicating the boundary between the cell 701 and the scribe line, X3 the boundary between cell 703 and the scribe line and X2 the point in between the edges of the scribe line at which the profile is stepped, e.g., the position to which the back electrode of cell 703 extends. The corresponding cross-sectional profile 725 of the scribed line including step 730 formed by the exposed back electrode of cell 703 is also shown. According to various embodiments, scribe line widths range from about 25-150 micrometers, though the methods may be employed for narrower or wider widths as well. The width of the unstepped portion of the scribe is D1, D1 being the distance between X1 and X2; and the width of stepped portion of the scribe is D2, D2 being the distance between X3 and X2. Examples of these widths are 25-75 micrometers, though other widths may be used as well. D1 and D2 may be approximately equal or they may be different depending on the particular integration scheme.

Figure 8:
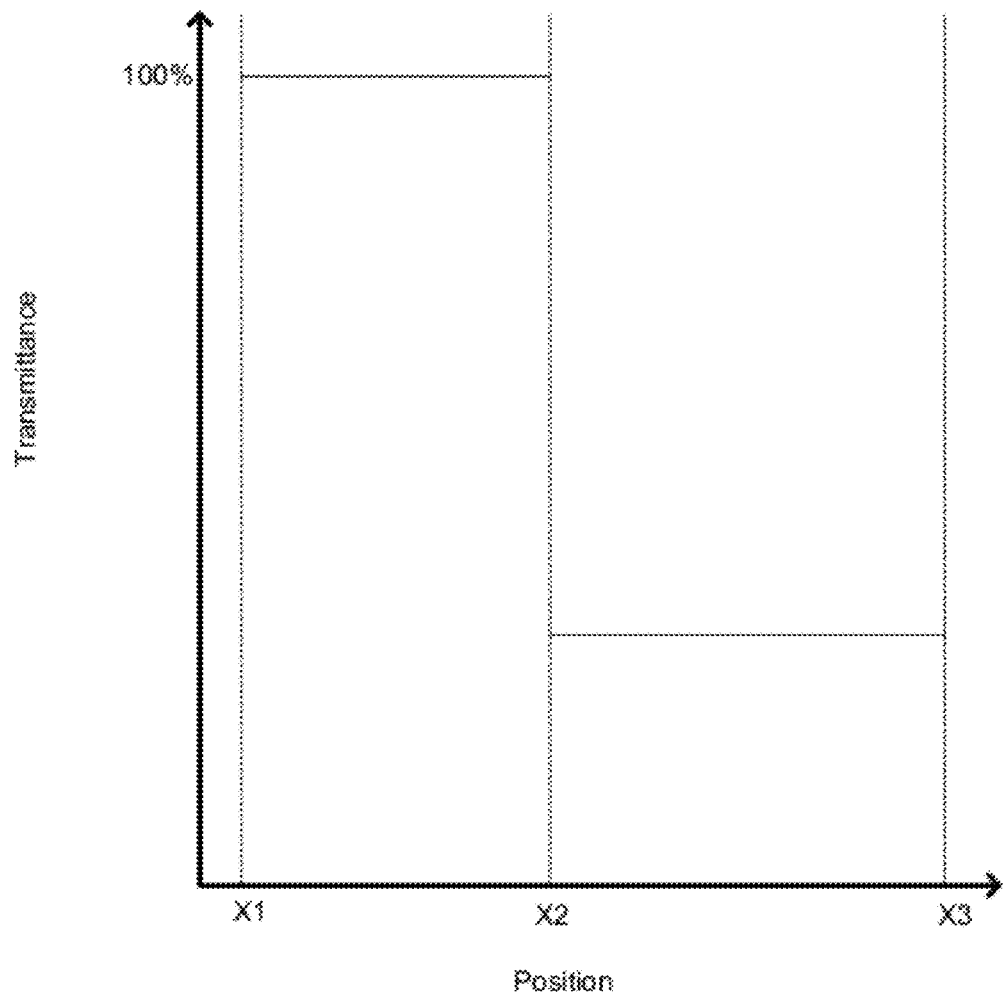
FIG. 8 is a graph representing variation of a mask transmittance across the width of a linear mask pattern that corresponds to a scribe line.

According to various embodiments, the transmittance of the photomask is varied according to position across the width of the transmitting region in a step-wise manner. FIG. 8 provides an example of a step-wise variation of transmittance across the width of a linear mask pattern; the transmittance is higher to increase ablation between positions X1 and X2; and lower between X2 and X3 to stop at the back contact or other desired layer. In certain embodiments, the dimensions of the mask are the same as those of the desired scribe line; in other embodiments, the mask dimensions may be larger with the subsequent imaging optics de-magnifying the beam that is incident on and ablates the solar cell structure to produce the scribe line.

For a 1× photomask (i.e., for a system in which the beam is not de-magnified after passing through the mask), the width ranges from about 25 to 150 microns in certain embodiments, corresponding to a scribe line width of 25 to 150 microns. A photomask having larger dimensions and de-magnifying imaging optics may be used in certain embodiments to make a more precise beam for sharper scribe features. In certain embodiments, a 2×, 3×, 4× or 5× de-magnifying imaging optics may be used with the photomask dimensions scaled appropriately. For example, for a 5× de-magnification imaging system a 100 micron wide scribe line would require the width of region 615 of the mask is 500 microns. In any of these cases, the mask dimensions are said to correspond to the stepped scribed profile dimensions. While step-wise variation is illustrated, in certain embodiments, the transmittance may be varied in other manners to obtain the desired profile. For example, in certain embodiments, the variation is multi-step, linear, or non-linear with respect to position.

Figure 9:
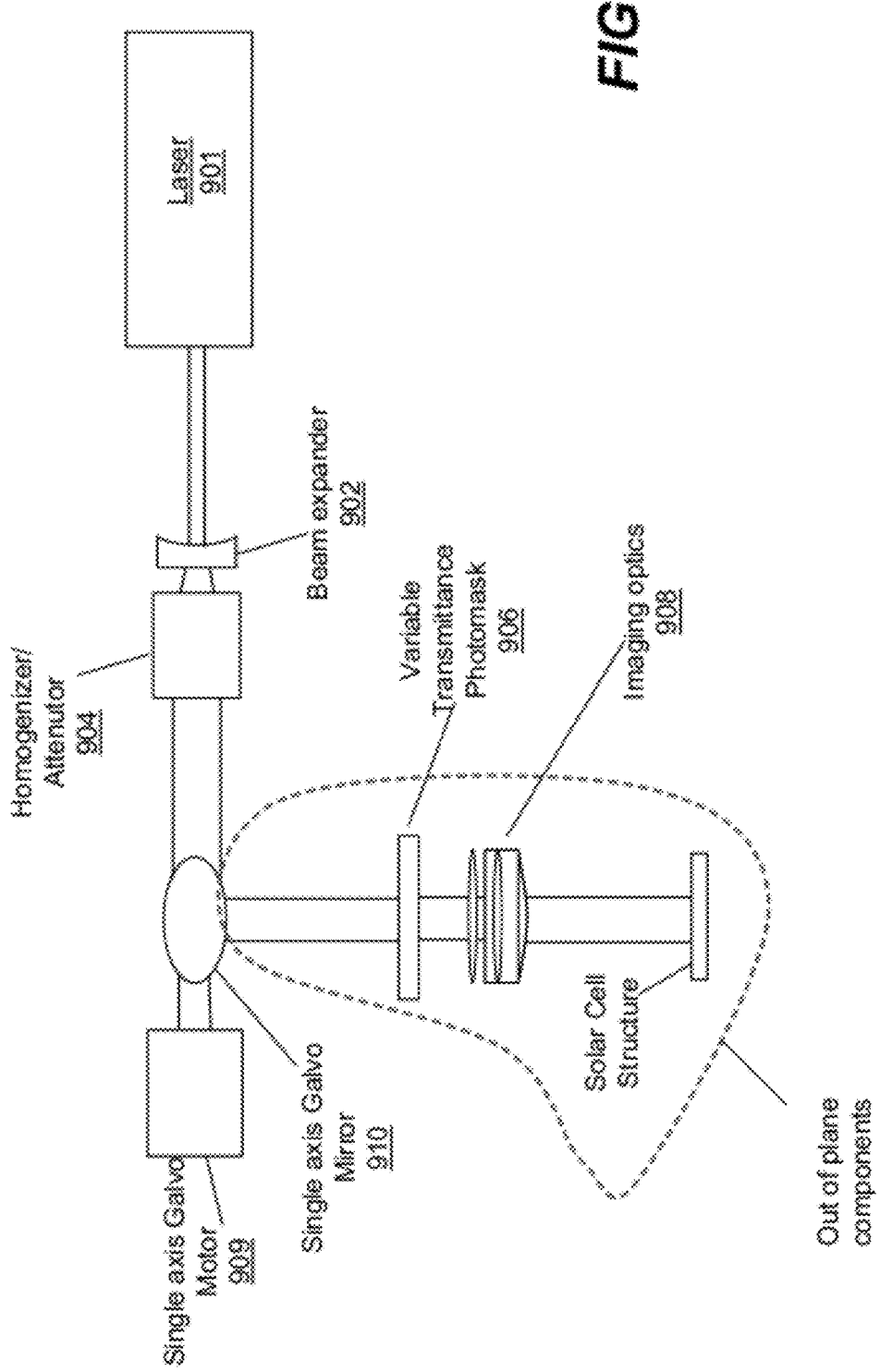
FIG. 9 is a diagram illustrating certain components of a system according to various embodiments.

FIG. 9 provides a schematic diagram of certain components of a system for scribing a solar cell structure according to various embodiments. Laser 901 is an excimer laser. Examples of excimer lasers that may be used in the systems described herein include ArF, KrF, XeBr, XeCl, XeF, KrCl, $Ar_2^*$, $Kr_2^*$, $F_2$, $Xe_2^*$, $Cl_2$ and $N_2$. It should be noted that some of these excimers produce wavelengths at 193 nm or below where atmosphere ambient can attenuate the beam energy as it propagates in free space. For these wavelengths an enclosed beam propagation medium that is purged with an inert gas should be used. Most excimer lasers output a quasi-rectangular beam having a near-Gaussian profile in the short axis of the rectangle and almost a top hat profile in the long axis. Beam expander 902 expands the beam to match the subsequent optics. Homogenizer/attenuator 904 produces a beam with a very flat intensity profile that enables uniform processing at the workpiece over the entire illuminated area. The system includes a galvo motor 909 and galvo mirror 910, which direct the laser beam from laser 901 along the scribe line. A single-axis galvo system is depicted, though in other embodiments, a dual axis galvo scanner may be used. Although not depicted, a lens may be placed between the galvo mirror 910 and the mask to allow telecentric scanning on the mask. This may be accomplished by putting the galvo rotation fulcrum in the front focus of the lens. As the galvo scans the beam it is incident on the mask after the lens at a perpendicular angle.

In certain embodiments, the size of the expanded homogenized beam may too large to implement easily with a galvo scanner. In this case a shuttle type linear scanner may be used. In certain embodiments of such a scanner, a large mirror is mounted on one linear stage which is in turn mounted on another linear stage to allow x and y axis axis scan capability.

Mask 906 may be made from a dielectric or other material. The desired partial transmission of the mask is achieved a gray scale type coating or a dot matrix coating on the material to produce the opaque (no transmission), partially transmitting and wholly transmitting regions. Examples of mask materials include fused silica and quartz. The coating on the mask depends on the operating wavelength and the fluence to be incident on the mask. For example, in certain embodiments, for excimer wavelengths 193 nm, 248 nm, 308 nm, and 351 nm the coating on the mask to reflect or partially reflect the beam is a dielectric coating for high fluence $>1$ $J/cm^2$, aluminum for fluence ranging from 0.05 to 1 $J/cm^2$), or chrome for fluence levels below 0.05 $J/cm^2$. One of skill in the art will understand that the coatings or fluences may vary depending on the specific implementation. Due to photomask and imaging optics size limitations, the material and/or the imaging system (mask plus imaging lens) are stepped and repeated to cover a work envelope that will produce scribe lengths, e.g., on the order of 1 meter or other common web size.

Although the foregoing invention has been described in some detail for purposes of clarity of understanding, it will be apparent that certain changes and modifications may be practiced within the scope of the invention. It should be noted that there are many alternative ways of implementing both the processes and apparatuses of the present invention. For example, the methods and systems may be used to form stepped profiles other than the ones depicted in the figures, e.g., for other solar cell integration schemes. For example, the step may include other layers. Multi-step profiles may be created according to various embodiments. Further, scribe lines having bends or curves may be formed using appropriately shaped masks and/or appropriately moving the mask with respect to the substrate. Accordingly, the present embodiments are to be considered as illustrative and not restrictive, and the invention is not to be limited to the details given herein.

What is claimed is:

1. A method of forming a monolithically integrated thin film photovoltaic module, the method comprising:
   providing a substrate having thin film photovoltaic materials deposited thereon,
   identifying a scribe line across the substrate;
   providing a photomask having at least one transmission region including a length and a width, said transmission region having a variable transmittance across its width;
   aligning the transmission region with the scribe line; and
   scanning an excimer laser beam along the length of the transmission region to form electrically unconnected photovoltaic cells on either side of the scribe line, wherein a scribed line profile formed by scanning the laser beam is stepped.

2. The method of claim 1 wherein scanning the laser beam across the substrate comprises ablating the thin film photovoltaic materials completely to leave an insulative layer exposed along a first portion of the scribe line; and ablating the thin film photovoltaic materials to leave a conductive thin film layer exposed along a second portion of the scribe line, wherein said first and second portions are substantially co-extensive with the scribe line.

3. The method of claim 1 wherein the photovoltaic cells each comprise a back electrical contact layer, an absorber layer and a top electrical contact layer.

4. The method of claim 3 wherein the stepped scribed line profile is defined by a substantially vertical first sidewall including the back electrical contact layer, the absorber layer and the top electrical contact layer; a bottom including an insulative layer; a step including the back contact layer; and a substantially vertical second sidewall extending from the back contact step and including the absorber layer and the top electrical contact layer.

5. The method of claim 3 wherein the back contact layer is selected from the group consisting of molybdenum, niobium, copper, silver, chromium, titanium, and zirconium.

6. The method of claim 3 wherein the absorber layer is selected from the group consisting of CIGS, CIS, CdTe, amorphous silicon, Cu2ZnSnS4 (CZTS).

7. The method of claim 1 wherein the photomask comprises a reflective coating on a fused silica or quartz substrate.

8. The method of claim 1 wherein the width of the stepped portion of the scribed line profile is about half the width of the scribe line.

9. The method of claim 1 further comprising forming insulator and conductive material in portion of the stepped scribed profile to electrically interconnect the unconnected photovoltaic cells.

10. The method of claim 1 wherein the transmittance of the transmission region is characterized by a bimodal distribution.

11. The method of claim 1 further comprising, after scanning an excimer laser beam along the length of the transmission region, moving the substrate relative to the photomask to align the transmission region with an unscanned length of the scribe line, and scanning the excimer laser beam along the length of the unscanned length.

* * * * *